(12) United States Patent
Feng et al.

(10) Patent No.: US 12,205,872 B2
(45) Date of Patent: Jan. 21, 2025

(54) PACKAGING STRUCTURE OF POWER SEMICONDUCTOR MODULE

(71) Applicant: STARPOWER SEMICONDUCTOR LTD., Zhejiang (CN)

(72) Inventors: Danting Feng, Jiaxing (CN); Junjun Fang, Jiaxing (CN)

(73) Assignee: STARPOWER SEMICONDUCTOR LTD., Zhejiang (CN)

( * ) Notice: Subject to any disclaimer, the term of this patent is extended or adjusted under 35 U.S.C. 154(b) by 0 days.

(21) Appl. No.: 17/798,055

(22) PCT Filed: May 27, 2022

(86) PCT No.: PCT/CN2022/095791
§ 371 (c)(1),
(2) Date: Aug. 5, 2022

(87) PCT Pub. No.: WO2023/000823
PCT Pub. Date: Jan. 26, 2023

(65) Prior Publication Data
US 2024/0203841 A1    Jun. 20, 2024

(30) Foreign Application Priority Data

Jul. 21, 2021 (CN) .......................... 202110823796.0
Jul. 21, 2021 (CN) .......................... 202121660635.6

(51) Int. Cl.
*H01L 23/495*    (2006.01)
*H01L 23/00*    (2006.01)
(Continued)

(52) U.S. Cl.
CPC ........ *H01L 23/49555* (2013.01); *H01L 24/45* (2013.01); *H01L 24/48* (2013.01);
(Continued)

(58) Field of Classification Search
CPC ... H01L 23/49555; H01L 24/45; H01L 24/48; H01L 25/072; H01L 23/49811; H01L 2224/45124; H01L 2224/45147; H01L 2224/48091; H01L 2224/48225; H01L 2924/10253; H01L 2924/10272; H01L 2924/1033; H01L 2924/13055;
(Continued)

(56) References Cited

U.S. PATENT DOCUMENTS

2003/0231840 A1 * 12/2003 Okada .................. G02B 6/4246
385/92

* cited by examiner

*Primary Examiner* — Robert G Bachner
(74) *Attorney, Agent, or Firm* — SoCal IP Law Group LLP; Mark Andrew Goldstein

(57) ABSTRACT

The invention discloses a novel packaging structure of a power semiconductor module, which mainly comprises an insulating radiating fin, a metal lead frame unit and a chip unit. The insulating radiating fin comprises an insulating layer, and an inner metal conducting layer and an outer metal conducting layer which are respectively arranged on two sides of the insulating layer; the metal lead frame unit mainly comprises a frame pin input portion, a frame pin output portion and a frame pin signal portion, the frame pin input portion is arranged on an upper side of the inner metal conducting layer in a solder welding mode, and the chip unit is welded to the middle of the inner metal conductive layer. The frame pin output portion is provided with an inner concave portion.

12 Claims, 6 Drawing Sheets

(51) Int. Cl.
*H01L 23/498* (2006.01)
*H01L 25/07* (2006.01)

(52) U.S. Cl.
CPC ...... *H01L 25/072* (2013.01); *H01L 23/49811* (2013.01); *H01L 2224/45124* (2013.01); *H01L 2224/45147* (2013.01); *H01L 2224/48091* (2013.01); *H01L 2224/48225* (2013.01); *H01L 2924/10253* (2013.01); *H01L 2924/10272* (2013.01); *H01L 2924/1033* (2013.01); *H01L 2924/13055* (2013.01); *H01L 2924/13091* (2013.01)

(58) Field of Classification Search
CPC ........... H01L 2924/13091; H01L 24/37; H01L 24/06; H01L 24/29; H01L 24/32; H01L 24/40; H01L 24/97; H01L 24/73; H01L 24/83; H01L 2224/32225; H01L 2224/40137; H01L 2224/48139; H01L 2224/48227; H01L 2224/48247; H01L 2224/49111; H01L 21/561; H01L 23/3107; H01L 23/3735; H01L 24/84; H01L 2224/0603; H01L 2224/37012; H01L 2224/4903; H01L 2224/73265; H01L 2224/83801; H01L 2224/8384; H01L 2224/84815; H01L 2924/181; H01L 2924/19107; H01L 23/49524; H01L 23/49562; H01L 24/49; H01L 2224/73221

See application file for complete search history.

PACKAGING STRUCTURE OF POWER SEMICONDUCTOR MODULE

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

RELATED APPLICATION INFORMATION

This patent claims priority from International PCT Patent Application No. PCT/CN2022/095791, filed May 27, 2022, entitled, "NOVEL PACKAGING STRUCTURE OF POWER SEMICONDUCTOR MODULE", which claims priority to Chinese Patent Application No. 202121660635.6, filed Jul. 21, 2021, and Chinese Patent Application No. 202110823796.0, filed Jul. 21, 2021, all of which are incorporated herein by reference in their entirety.

BACKGROUND

Field

The invention relates to the field of power electronics, and more particularly, to a novel packaging structure of a power semiconductor module.

Description of the Related Art

At present, field effect transistor modules are widely used in inverters, welding machines, induction heating, uninterruptible power supply, wind power generation and electric vehicles. When power semiconductor devices are applied to the above-mentioned fields, increasingly demanding requirements are imposed on various aspects, such as a volume of a package, power density, and reliability.

In the traditional power semiconductor module package, in order to balance between good reliability and heat dissipation conditions, and the power density, the power semiconductor module tends to become large in volume for having a higher power density, and requirements for external heat sink conditions and installation requirements are becoming increasingly higher. Traditionally packaged power semiconductor modules need to be installed with insulating gaskets or coated with thermally conductive materials when installed in a client. In this way, the thermal contact resistance of the package is improved, the heat dissipation efficiency of the package and the impact resistance of a chip are reduced. In most cases, the traditionally packaged power semiconductor modules make an electrical performance connection by using copper wire or aluminum wire bonding, and the bonding wire density depends on the current and cost considerations. As the number of the bonding wires is small, a circuit formed by the bonding aluminum wires and power terminals is bound to have large parasitic inductance and resistance, and a relatively large voltage stress may be applied to the chip during the turn-off process.

SUMMARY OF THE INVENTION

In order to solve the above-mentioned problems in the prior art, the present invention provides a novel packaging structure of a power semiconductor module, which helps to solve the problems of low heat dissipation efficiency, low power density, large parasitic inductance and large resistance, to name a few.

Objects of the invention are achieved by adopting the following technical solution:

a novel packaging structure of a power semiconductor module, which mainly comprises an insulating radiating fin, a metal lead frame unit and a chip unit on the insulating radiating fin, wherein the insulating radiating fin comprises an insulating layer, and an inner metal conducting layer and an outer metal conducting layer which are respectively arranged on two sides of the insulating layer, a middle portion of the inner metal conducting layer is a flat area for welding a chip, the metal lead frame unit mainly comprises a frame pin input portion, a frame pin output portion and a frame pin signal portion, the frame pin input portion is arranged on an upper side of the inner metal conducting layer in a solder welding mode, and the chip unit is welded to the middle of the inner metal conductive layer, the frame pin output portion is provided with an inner concave portion corresponding to the position of the chip unit and is welded and fixed with the chip unit through an outer end surface of the inner concave portion, the inner concave portion corresponding to the position of the chip unit may also be welded to the chip unit using a high-density metal bonding lead by ultrasonic welding instead of being welded and fixed with the chip unit through the outer end surface of the inner concave portion, a signal portion of the chip unit is connected with the frame pin signal portion through a metal bonding lead by ultrasonic bonding; and the insulating radiating fin, the chip unit and the inner concave portion on the frame pin output portion are coated with a plastic package body, and the outer metal conducting layer of the insulating radiating fin is exposed to the plastic package body and is flush with an outer wall of the plastic package body.

Furthermore, the inner concave portion is a groove formed on the frame pin output portion by sinking or extrusion, the groove is matched with the chip unit in number, shape and size, and the grooves can be arranged horizontally or longitudinally, and the groove has a smooth, burr-free outer surface; all the grooves are fully arranged on a wall surface of the frame pin output portion or one of the grooves is arranged on a wall surface of an upper side of the frame pin output portion to form a notch.

Furthermore, high density metal bonding leads are used for the ultrasonic welding, and the high density metal bonding leads are arranged as much as possible on a surface of the chip, so as to make a arrangement where the chip can carry the maximum density.

Furthermore, the frame pin output portion is provided with a bent edge so that an output pin of the frame pin output portion is flush with an input pin of the frame pin input portion, and etched grooves or round holes are formed on the frame pin input portion and the frame pin output portion for reducing mechanical stress and increasing a bonding force with injection molding materials.

Furthermore, a channel is formed by etching through the inner metal conducting layer of the insulating radiating fin for leading out an electric signal from the chip unit, the signal portion of the chip unit is bonded to an individual channel of the inner metal conducting layer through the metal bonding leads and jumps to the frame pin signal portion for leading out a chip signal.

Furthermore, a channel, two channels or more channels can be formed by etching through the inner metal conducting layer of the insulating radiating pin for leading out signal poles from different chip units.

Furthermore, the inner concave portion is welded to the chip unit by reflow soldering process, and a welding material is a solder having a melting point high than 260° C.; the inner metal conducting layer is welded to the chip unit by silver paste sintering or tin solder welding.

Furthermore, the inner metal conducting layer and the outer metal conducting layer are made of aluminum or a copper material with gold plated on a whole surface; the metal bonding leads are made of an aluminum or copper material.

By adopting the above-mentioned technical solutions, the present invention has the beneficial effects that the invention provides a novel packaging structure of a power semiconductor module. In this way, an area of a chip loading area is optimized, an upper limit of a rated current of a package is increased, and a double-sided welding of the chip is performed by using a metal-sunken groove structure, so as to increase the heat capacity; overcurrent capability is improved, a sheet metal lead frame structure is adopted in the layout, an upper and lower structure of an lamination is maintained in a circuit design, the parasitic inductance and resistance of the module is reduced, the voltage stress of the chip is reduced, acquisition of electric performance is carried out by using a signal terminal as close as possible to a chip surface, signal interference from an induced electromotive force generated by a common terminal is decreased; and output power, safety and reliability are greatly improved while ensuring the heat dissipation efficiency.

DETAILED DESCRIPTION

Figure 1:
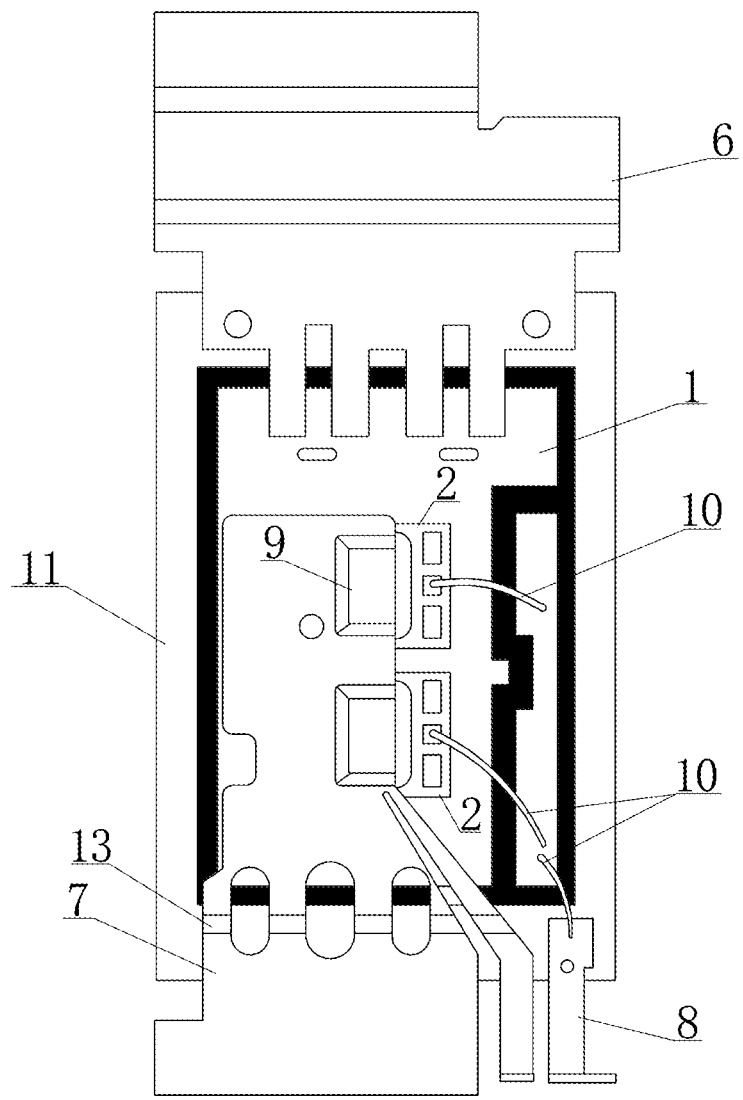
FIG. 1 is a schematic view showing an overall structure of a packaging structure according to the present invention.
Figure 2:
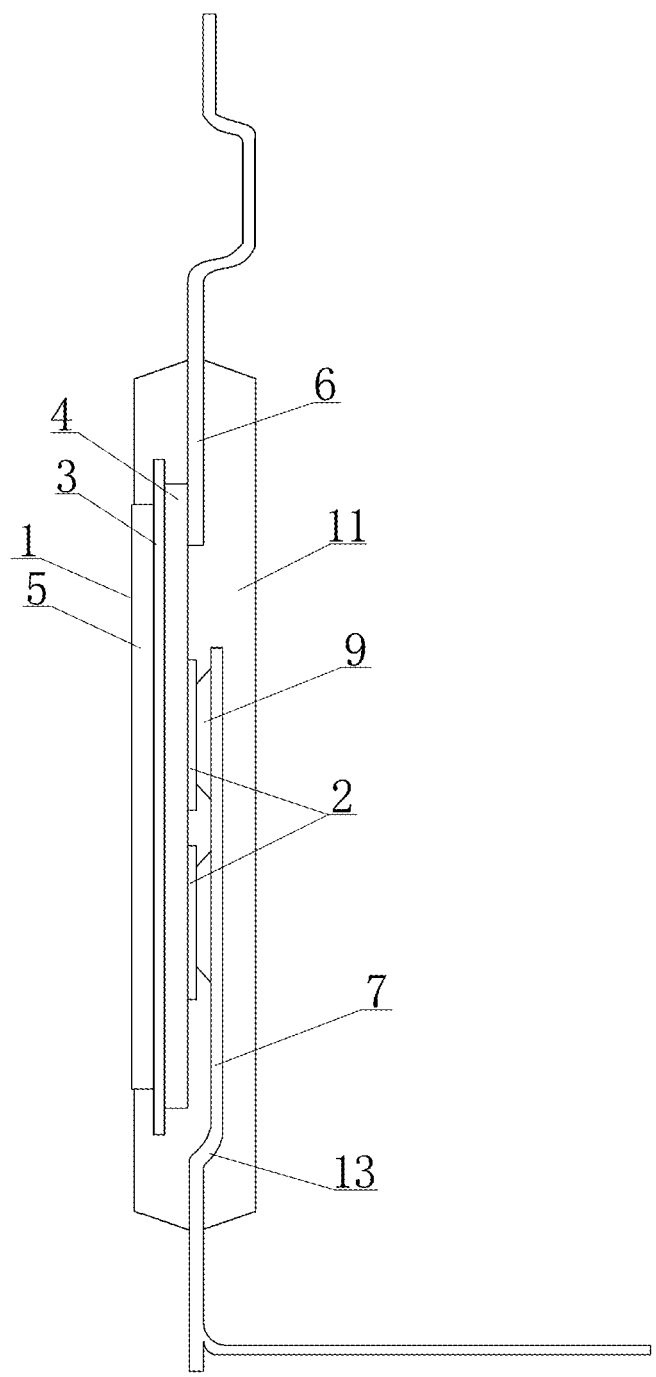
FIG. 2 is a side schematic view of FIG. 1.
Figure 3:
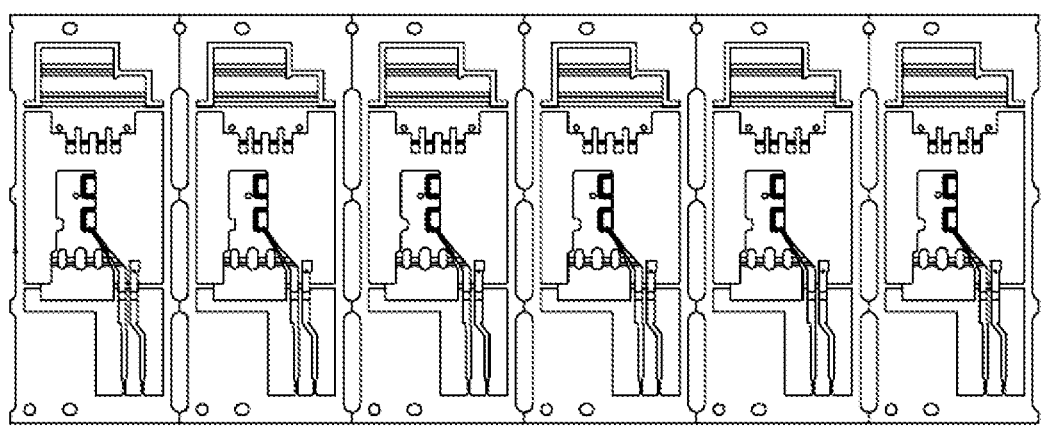
FIG. 3 is a schematic structural view of a metal lead frame multi-lead unit strip used in the packaging structure of the present invention.
Figure 4:
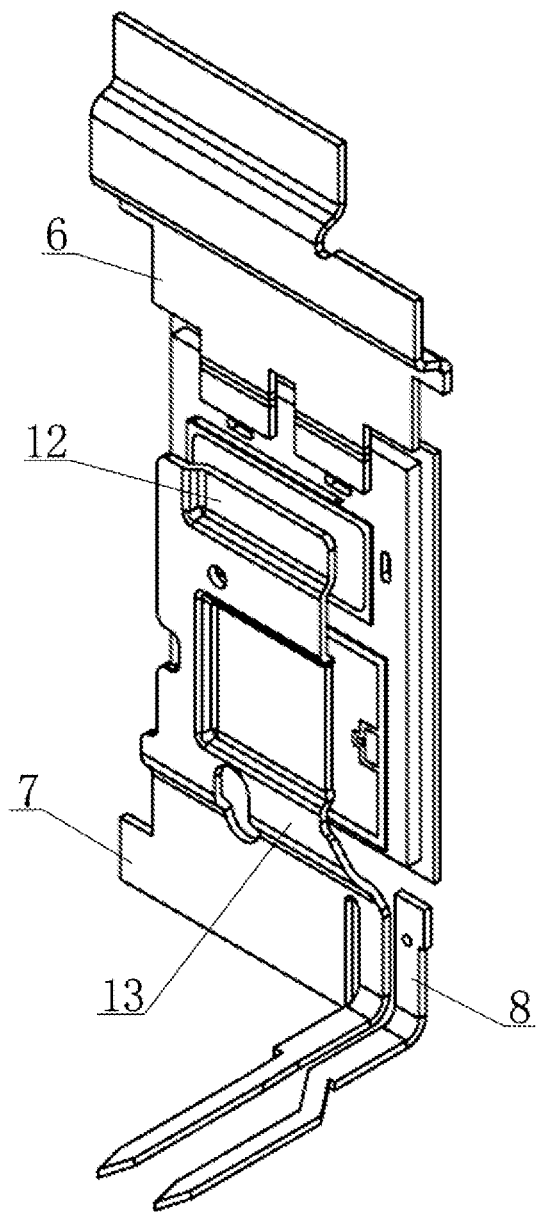
FIG. 4 is another schematic view of the packaging structure according to the present invention.
Figure 5A:
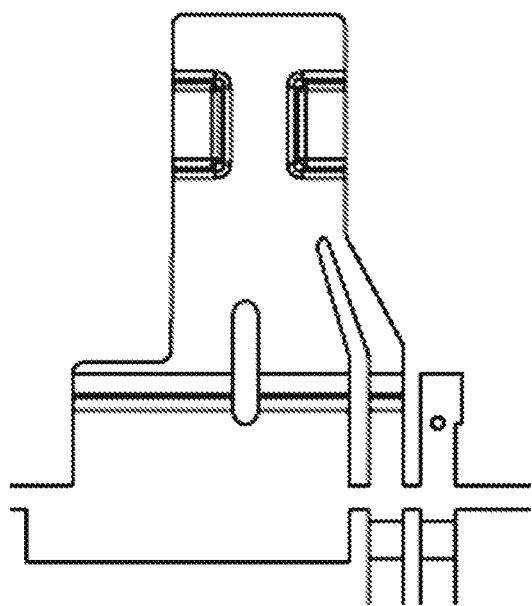
FIGS. 5a and 5b are schematic views of the grooves when they are arranged laterally according to the present invention.
Figure 5B:
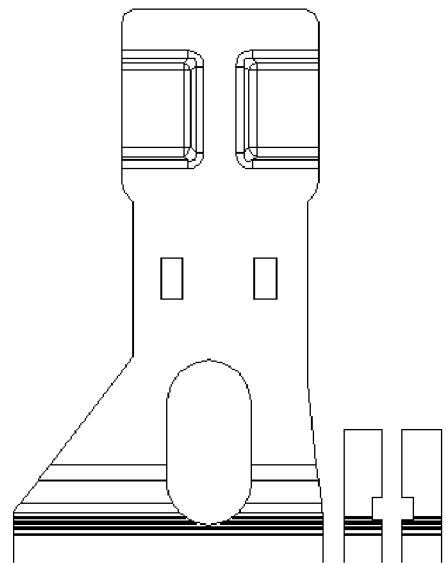
Figure 6:
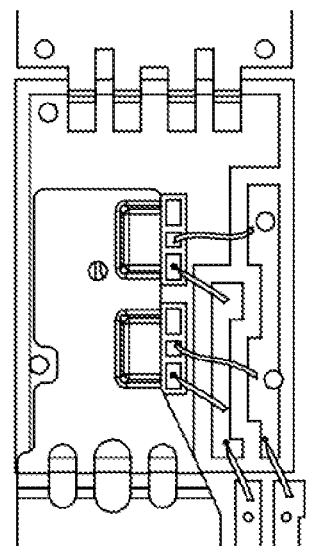
FIG. 6 is a scheme for a insulating radiating fin different from that of the insulating radiating fin shown in FIG. 1 according to the present invention.
Figure 7:
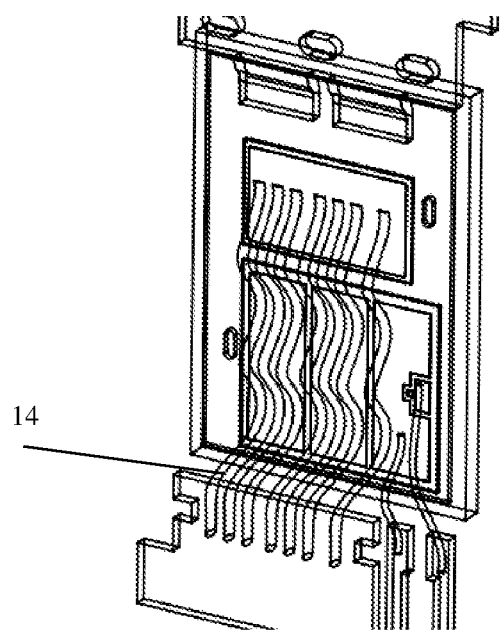
FIG. 7 is a schematic view of an internal structure of the power semiconductor module in an embodiment of the utility model, in which a metal lead frame extension is replaced with a metal bonding lead.

The present invention will be further described hereinafter with reference to the accompanying drawings and embodiments of the present invention, allowing those skilled in the art to clearly understand objects, technical solutions and advantages of the present invention.

Throughout the description of the invention, it should be understood that orientations or positional relationship indicated by terms such as "upper", "lower", "left", "right", "inner", "outer", "horizontal", "vertical", refer to orientations or positional relationship as shown in the accompanying drawings. Such orientations are illustrated for better understanding the present invention, rather than indicating or implying devices or components must have particular orientations, therefore, they should not be construed as a limitation of the present invention.

As shown in FIGS. 1-7, a novel packaging structure of a power semiconductor module according to the present invention mainly comprises an insulating radiating fin 1, a metal lead frame unit and a chip unit 2 on the insulating radiating fin, the metal lead frame unit is made of copper or copper alloy, the insulating radiating fin has a structure in which a ceramic layer is sandwiched between double-sided metal layers, wherein the insulating radiating fin comprises an insulating layer 3, and an inner metal conducting layer 4 and an outer metal conducting layer 5 which are respectively arranged on two sides of the insulating layer 3, a middle portion of the inner metal conducting layer 4 is a flat area for welding a chip, the metal lead frame unit mainly comprises a frame pin input portion 6, a frame pin output portion 7 and a frame pin signal portion 8, the frame pin input portion 6 is arranged on an upper side of the inner metal conducting layer 4 in a solder welding mode, the chip unit 2 is welded to the middle of the inner metal conductive layer 2, the frame pin output portion 7 is provided with an inner concave portion 9 corresponding to the position of the chip unit 2 and is welded and fixed with the chip unit 2 through an outer end surface of the inner concave portion 9, the inner concave portion 9 corresponding to the position of the chip unit may also be welded to the chip unit using a high-density metal bonding lead 14 by ultrasonic welding instead of being welded and fixed with the chip unit 2 through the outer end surface of the inner concave portion, a signal portion of the chip unit 2 is connected with the frame pin signal portion 8 through a metal bonding lead by ultrasonic bonding; and the insulating radiating fin 1, the chip unit 2 and the inner concave portion 9 on the frame pin output portion 7 are coated with a plastic package body 11, and the outer metal conducting layer 5 of the insulating radiating fin 1 is exposed to the plastic package body 11 and is flush with an outer wall of the plastic package body 11. The exposed surface has gold or silver plated on a whole surface and remains exposed and not covered by the plastic package body.

The chip unit 2 of the present invention may be a silicon-based chip or a silicon carbide-based chip or a GaN-based IGBT/DIODE/MOSFET chip. The inner metal conducting layer 4 and the outer metal conducting layer 5 are both made of aluminum or a copper material with gold plated on a whole surface, the metal bonding lead 10 is made of aluminum or the copper material. After the whole module is manufactured, the relative position is fixed by covering the plastic package body, thereby effectively improving a creepage distance and overall reliability between corresponding metal pins of the frame pin input portion and the frame pin output portion.

As shown in FIGS. 1-5, the inner concave portion 9 is a groove formed by sinking or extruding a metal sheet extending on the frame pin output portion 7. The groove is matched with the chip unit in number, shape and size, and the grooves can be arranged horizontally or longitudinally, and the groove has a smooth, burr-free outer surface; all the grooves can be arranged vertically or horizontally or in any other arrangements as shown in FIGS. 5a and 5b. All the grooves are fully arranged on a wall surface of the frame pin output portion 7 or one of the grooves is arranged on a wall surface of an upper side of the frame pin output portion 7 to form a notch 12. The frame pin output portion 7 is provided with a bent edge 13 so that an output pin of the frame pin output portion 7 is flush with an input pin of the frame pin input portion 6, and etched grooves or round holes are formed on the frame pin input portion 6 and the frame pin output portion 7 for reducing mechanical stress and increasing a bonding force with injection molding materials.

As shown in FIG. 1, a channel is formed by etching through the inner metal conducting layer 4 of the insulating radiating fin 1 for leading out an electric signal from the chip unit 2, the signal portion of the chip unit 2 is bonded to an individual channel of the inner metal conducting layer 4 through the metal bonding lead 10 and jumps to the frame pin signal portion 8 for leading out a chip signal. The inner concave portion 9 is welded to the chip unit 2 by reflow soldering process, and a welding material is a solder having a melting point high than 260° C.; the inner metal conducting layer 4 is welded to the chip unit 2 by silver paste sintering or tin solder welding.

The invention provides a novel packaging structure of a power semiconductor module. In this way, an area of a chip loading area is optimized, an upper limit of a rated current of a package is increased, and a double-sided welding of the chip is performed by using a metal sunk groove structure, so as to increase the heat capacity; overcurrent capability is improved, a sheet metal lead frame structure is adopted in the layout, an upper and lower structure of an lamination is maintained in a circuit design, the parasitic inductance and resistance of the module is reduced, the voltage stress of the chip is reduced, acquisition of electric performance is carried out by using a signal terminal as close as possible to a chip surface, signal interference from an induced electromotive force generated by a common terminal is decreased; and output power, safety and reliability are greatly improved while ensuring the heat dissipation efficiency.

The specific embodiments described herein are merely illustrative of the principles of the present invention and its efficacy, and are not intended to limit the present invention. Anyone skilled in the art can modify or change the above-mentioned embodiments without departing from the spirit and scope of the present invention. Therefore, all equivalent modifications or verifications made by those skilled in the art shall fall within the scope of the claims of the invention without departing from the spirit and technical teachings disclosed in the invention.

It is claimed:

1. A novel packaging structure of a power semiconductor module, which mainly comprises an insulating radiating fin, a metal lead frame unit and a chip unit on the insulating radiating fin, wherein the insulating radiating fin comprises an insulating layer, and an inner metal conducting layer and an outer metal conducting layer which are respectively arranged on two sides of the insulating layer; the metal lead frame unit mainly comprises a frame pin input portion, a frame pin output portion and a frame pin signal portion, the frame pin input portion is arranged on an upper side of the inner metal conducting layer in a solder welding mode, and the chip unit is welded to the middle of the inner metal conductive layer, the frame pin output portion is provided with an inner concave portion corresponding to the position of the chip unit and is welded and fixed with the chip unit through an outer end surface of the inner concave portion, a signal portion of the chip unit is connected with the frame pin signal portion through a metal bonding lead; and the insulating radiating fin, the chip unit and the inner concave portion on the frame pin output portion are coated with a plastic package body, and the outer metal conducting layer of the insulating radiating fin is exposed to the plastic package body and is flush with an outer wall of the plastic package body.

2. The novel packaging structure of the power semiconductor module of claim 1, wherein the inner concave portion is a groove formed on the frame pin output portion by sinking or extrusion, the groove is matched with the chip unit in number, shape and size, and the groove has a smooth, burr-free outer surface; all the grooves are fully arranged on a wall surface of the frame pin output portion or one of the grooves is arranged on a wall surface of an upper side of the frame pin output portion to form a notch.

3. The novel packaging structure of the power semiconductor module of claim 1, wherein the frame pin output portion is provided with an inner concave structure corresponding to the position of the chip unit, the inner concave structure can also be connected to the chip unit by using a high arrangement density metal bonding lead.

4. The novel packaging structure of the power semiconductor module of claim 1, wherein the frame pin output portion is provided with a bent edge so that an output pin of the frame pin output portion is flush with an input pin of the frame pin input portion, and etched grooves or round holes are formed on the frame pin input portion and the frame pin output portion for reducing mechanical stress and increasing a bonding force with injection molding materials.

5. The novel packaging structure of the power semiconductor module of claim 1, wherein a channel is formed by etching through the inner metal conducting layer of the insulating radiating fin for leading out an electric signal from the chip unit, the signal portion of the chip unit is bonded to an individual channel of the inner metal conducting layer through the metal bonding lead and jumps to the frame pin signal portion for leading out a chip signal.

6. The novel packaging structure of the power semiconductor module of claim 1, wherein the inner concave portion is welded to the chip unit by reflow soldering process, and a welding material is a solder having a melting point high than 260° C.; the inner metal conducting layer is welded to the chip unit by silver paste sintering or tin solder welding.

7. The novel packaging structure of the power semiconductor module of claim 6, wherein the inner metal conducting layer and the outer metal conducting layer are made of aluminum or a copper material with gold plated on a whole surface; the metal bonding lead is made of an aluminum or copper material.

8. The novel packaging structure of the power semiconductor module of claim 2, wherein the frame pin output portion is provided with a bent edge so that an output pin of the frame pin output portion is flush with an input pin of the frame pin input portion, and etched grooves or round holes are formed on the frame pin input portion and the frame pin output portion for reducing mechanical stress and increasing a bonding force with injection molding materials.

9. The novel packaging structure of the power semiconductor module of claim 2, wherein the inner concave portion is welded to the chip unit by reflow soldering process, and a welding material is a solder having a melting point high than 260° C.; the inner metal conducting layer is welded to the chip unit by silver paste sintering or tin solder welding.

10. The novel packaging structure of the power semiconductor module of claim 5, wherein the inner concave portion is welded to the chip unit by reflow soldering process, and a welding material is a solder having a melting point high than 260° C.; the inner metal conducting layer is welded to the chip unit by silver paste sintering or tin solder welding.

11. The novel packaging structure of the power semiconductor module of claim 9, wherein the inner metal conducting layer and the outer metal conducting layer are made of aluminum or a copper material with gold plated on a whole surface; the metal bonding lead is made of an aluminum or copper material.

12. The novel packaging structure of the power semiconductor module of claim 10, wherein the inner metal conducting layer and the outer metal conducting layer are made of aluminum or a copper material with gold plated on a whole surface; the metal bonding lead is made of an aluminum or copper material.

\* \* \* \* \*